(12) United States Patent
Levy et al.

(10) Patent No.: US 8,750,657 B2
(45) Date of Patent: Jun. 10, 2014

(54) FLIP-CHIP OPTICAL INTERFACE WITH MICRO-LENS ARRAY

(71) Applicant: Mellanox Technologies Ltd., Yokneam (IL)

(72) Inventors: Shmuel Levy, Kiryat Tivon (IL); Shai Rephaeli, Kiryat Tivon (IL); Rafi Lagziel, Modiin (IL)

(73) Assignee: Mellanox Technologies Ltd., Yokneam (IL)

( * ) Notice: Subject to any disclaimer, the term of this patent is extended or adjusted under 35 U.S.C. 154(b) by 0 days.

(21) Appl. No.: 13/677,374

(22) Filed: Nov. 15, 2012

(65) Prior Publication Data

US 2014/0133797 A1    May 15, 2014

(51) Int. Cl.
*G02B 6/12* (2006.01)
*G02B 6/36* (2006.01)
*G02B 6/43* (2006.01)

(52) U.S. Cl.
USPC .................................. 385/14; 385/89; 385/93

(58) Field of Classification Search
USPC .................................... 385/89, 93
See application file for complete search history.

(56) References Cited

U.S. PATENT DOCUMENTS

| | | |
|---|---|---|
| 4,130,343 A | 12/1978 | Miller et al. |
| 4,337,759 A | 7/1982 | Popovich et al. |
| 4,979,787 A | 12/1990 | Lichtenberger |
| 5,073,003 A | 12/1991 | Clark |
| 5,404,869 A | 4/1995 | Parkyn, Jr. et al. |
| 5,917,976 A * | 6/1999 | Yamaguchi ..................... 385/88 |
| 6,132,107 A | 10/2000 | Morikawa |
| 6,456,766 B1 | 9/2002 | Shaw et al. |
| 6,491,447 B2 | 12/2002 | Aihara |
| 6,567,574 B1 | 5/2003 | Ma et al. |
| 6,697,399 B2 | 2/2004 | Kimura et al. |
| 6,721,187 B2 | 4/2004 | Hall et al. |
| 6,741,777 B2 | 5/2004 | Jewell et al. |
| 6,817,782 B2 | 11/2004 | Togami et al. |
| 7,040,814 B2 * | 5/2006 | Morimoto et al. ............... 385/88 |
| 7,049,704 B2 | 5/2006 | Chakravorty et al. |
| 7,267,553 B2 | 9/2007 | Sone |
| 7,289,701 B2 | 10/2007 | Lam et al. |
| 7,350,985 B2 * | 4/2008 | Laughlin et al. ................ 385/89 |
| 7,515,415 B2 | 4/2009 | Monfarad et al. |
| 7,538,358 B2 | 5/2009 | Badehi et al. |
| 7,665,911 B2 | 2/2010 | Hamazaki |
| 8,043,877 B2 | 10/2011 | Badehi et al. |
| 8,115,302 B2 | 2/2012 | Andry et al. |

(Continued)

OTHER PUBLICATIONS

International Electrotechnical Commision, "Fiber Optic Connector Interfaces—Part 5: Type MT Connector Family", IEC document No. IEC61754-5, second edition, 32 pages, Jul. 2005.

(Continued)

*Primary Examiner* — Omar Rojas
(74) *Attorney, Agent, or Firm* — D. Kligler I.P. Services Ltd.

(57) ABSTRACT

An apparatus includes an optically opaque substrate, which includes first and second opposite surfaces and has one or more openings traversing through the substrate between the first and second surfaces. One or more optical transducers are attached to the first surface of the substrate so as to emit or detect light via the respective openings. One or more lenses are positioned against the respective openings on the second surface of the substrate, and are configured to couple the light between the optical transducers and respective optical fibers.

14 Claims, 3 Drawing Sheets

(56) References Cited

U.S. PATENT DOCUMENTS

| | | |
|---|---|---|
| 8,144,473 B2 | 3/2012 | Yumoto et al. |
| 8,272,788 B2 | 9/2012 | Ohta |
| 8,315,287 B1 | 11/2012 | Roggero et al. |
| 2008/0031629 A1 | 2/2008 | Nguyen et al. |
| 2012/0051685 A1 | 3/2012 | Su et al. |
| 2013/0156386 A1 | 6/2013 | Miller |

OTHER PUBLICATIONS

U.S. Appl. No. 13/532,829 Office Action dated Oct. 4, 2013.
Levy et al., U.S. Appl. No. 13/366,326, filed Feb. 5, 2012.
Levy et al., U.S. Appl. No. 13/419,447, filed Mar. 14, 2012.
Levy et al., U.S. Appl. No. 13/419,449, filed Mar. 14, 2012.
Levy, S., U.S. Appl. No. 13/481,874, filed May 28, 2012.
Levy et al., U.S. Appl. No. 13/369,324, filed Feb. 9, 2012.
Connected Fibers, LLC., "MT Ferrules", Datasheet, Jan. 2009.
Lee et al., "Silicon Optical Bench for Transmitter Module", Department of Optics and Photonics, National Central University, Taiwan, Oct. 19, 2009.
"Glass and Silicon Packages Webinar", Georgia Institute of Technology, 3D-Systems Packaging Research Center, Atlanta, USA, Jul. 21, 2010.
Micralyne, Inc., "MEMS Optical Components", Apr. 5, 2012.
Eldada et al., "Advances in Polymer Integrated Optics", IEEE Journal of Selected Topics in Quantum Electronics, vol. 5, No. 1, pp. 54-68, Jan./Feb. 2000.
Levy et al., U.S. Appl. No. 13/731,025, filed Dec. 30, 2012.
Lagziel et al., U.S. Appl. No. 13/851,178, filed Mar. 27, 2013.
Stockham et al., "Assembly of micro-optical systems with mechanical positioning", Proceedings of the SPIE, Optomechatronic Micro/Nano Devices and Components II, 637609, Oct. 13, 2006.
Levy et al., U.S. Appl. No. 13/532,829, filed Jun. 26, 2012.
U.S. Appl. No 13/369,324 Office Action dated Nov. 4, 2013.
U.S. Appl. No. 13/366,326 Office Action dated Mar. 27, 2014.
U.S. Appl. No. 13/731,025 Office Action dated Mar. 20, 2014.

* cited by examiner

FLIP-CHIP OPTICAL INTERFACE WITH MICRO-LENS ARRAY

FIELD OF THE INVENTION

The present invention relates generally to optical communication devices, and particularly to optical interface modules.

BACKGROUND OF THE INVENTION

Optical interface modules are used in communication equipment for converting optical signals into electrical signals and vice versa. Some optical interface modules comprise components such as Photo-Detectors (PDs) and Trans-Impedance Amplifiers (TIAs) for optical reception, drivers and Vertical Cavity Surface-Emitting Lasers (VCSELs) for optical transmission, high-speed electrical connectors, as well as light coupling optics for coupling light to and from optical fibers that are connected to the optical interface module.

For example, U.S. Pat. No. 7,049,704, whose disclosure is incorporated herein by reference, describes a package allowing both electrical and optical coupling between one or more integrated circuits and a printed circuit board (PCB). The package has an optical waveguide structure in addition to electrical connections. An optically active device is flip-chip bonded directly to an integrated circuit using solder bump technology. The optically active device has a lens directly attached to it to facilitate optical coupling to the optical waveguide. The integrated circuit is flip-chip bonded to a Ball Grid Array (BGA) package. The BGA package is bonded to the PCB using solder reflow technology.

U.S. Patent Application Publication 2012/0051685, whose disclosure is incorporated herein by reference, describes a technique in which a flip-chip assembly manufacturing process is augmented by process steps to create a VCSEL flip-chip assembly comprising a plurality of semiconductor devices having respective arrays of a small number of VCSELs thereon, which are mounted on a substrate to form a large array of VCSELs that are precisely optically aligned with their respective optical coupling elements.

SUMMARY OF THE INVENTION

An embodiment of the present invention that is described herein provides an apparatus including an optically opaque substrate, one or more optical transducers, and one or more lenses. The optically opaque substrate has first and second opposite surfaces and one or more openings traversing through the substrate between the first and second surfaces. The optical transducers are attached to the first surface of the substrate so as to emit or detect light via the respective openings. The lenses are positioned against the respective openings on the second surface of the substrate, and are configured to couple the light between the optical transducers and respective optical fibers.

In some embodiments, the substrate includes a Printed Circuit Board (PCB), and the optical transducers are attached using flip-chip mounting to pads on the first surface of the PCB. The PCB typically includes electrical traces for connecting the optical transducers via the pads to one or more electronic components.

In some embodiments, the apparatus includes a connector block, which is configured to hold ends of the optical fibers against the respective lenses, such that the ends of the optical fibers are flush with an edge of the connector block. In an embodiment, the lenses are configured to compensate for a divergence of the light traversing the openings between the optical transducers on the first surface and the lenses on the second surface of the substrate. In a disclosed embodiment, an optical characteristic of the lenses is defined depending on a thickness of the substrate.

In another embodiment, the lenses are included in a lens assembly, which is glued to a connector that terminates the optical fibers. In yet another embodiment, the lenses are included in a lens assembly, and the apparatus includes a spring fitting for attaching the lens assembly to a connector that terminates the optical fibers.

There is additionally provided, in accordance with an embodiment of the present invention, a method including providing an optically opaque substrate, which includes first and second opposite surfaces and has one or more openings traversing through the substrate between the first and second surfaces. One or more optical transducers are attached to the first surface of the substrate so as to emit or detect light via the respective openings. One or more lenses are positioned against the respective openings on the second surface of the substrate, so as to couple the light between the optical transducers and respective optical fibers.

There is further provided, in accordance with an embodiment of the present invention, a cable assembly including one or more optical fibers and an optical interface module that terminates the optical fibers. The optical interface module includes an optically opaque substrate, one or more optical transducers and one or more lenses. The optically opaque substrate includes first and second opposite surfaces and has one or more openings traversing through the substrate between the first and second surfaces. The optical transducers are attached to the first surface of the substrate so as to emit or detect light via the respective openings. The lenses are positioned against the respective openings on the second surface of the substrate, and are configured to couple the light between the optical transducers and the respective optical fibers.

The present invention will be more fully understood from the following detailed description of the embodiments thereof, taken together with the drawings in which:

DETAILED DESCRIPTION OF EMBODIMENTS

Overview

Figure 1:
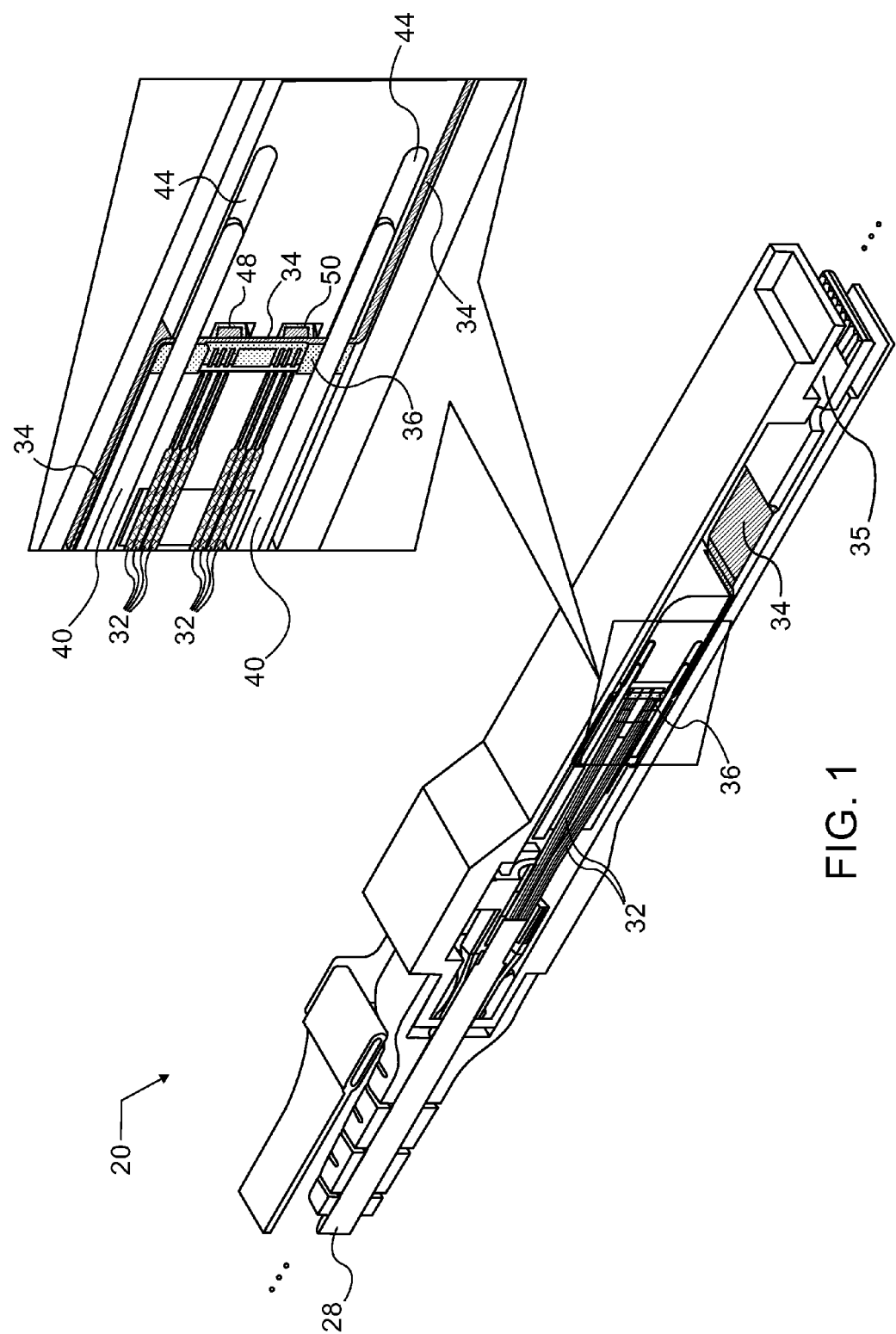
FIG. 1 is a cross section of an optical interface module, in accordance with an embodiment of the present invention.

Embodiments of the present invention that are described herein provide improved optical interface modules and cable assemblies. In some disclosed embodiments, an optical interface comprises one or more optical transducers (e.g., Vertical-Cavity Surface-Emitting Lasers—VCSELs or Photo-Detectors—PDs) that convert electrical signals into optical signals or vice versa. The optical transducers are attached to a substrate, such as a flexible Printed Circuit Board (PCB), which carries the electrical signals to and from the transducers. The optical signals are conveyed to and from the transducers via respective optical fibers. Optical interfaces of this sort may be used, for example, in optical cable assemblies that connect to communication equipment such as switches.

In some embodiments, an array of optical transducers is attached to the substrate using flip-chip mounting. Flip-chip interconnection enables low distortion of the electrical signals, which is important for maintaining signal integrity, especially at high signal bandwidths. In this mounting configuration, however, the transducer active area (and thus the direction of light emission or detection) points toward the surface of the substrate. Therefore, the transducers are mounted against respective openings that are cut in the substrate, enabling the light to pass through the openings to the opposite surface of the substrate.

In addition, an array of micro-lenses is coupled to the opposite surface of the substrate, one micro-lens against each transducer. Optical fibers are coupled to the respective micro-lenses. Since the ends of the fibers are not directly butt-coupled to the transducers, but rather separated by the thickness of the substrate, the light diverges as it passes through the openings. The micro-lenses collimate or focus the light so as to compensate for this divergence.

In some embodiments, the overall optical chain, including fiber ends, lenses, substrate openings and transducers, is aligned using guide pins.

It is possible in principle to allow the ends of the fibers to protrude through the openings in the PCB until reaching the transducers, and in this way to eliminate the need for the micro-lenses. This sort of solution, however, requires the optical connector to be manufactured with protruding fiber tips, and the assembly process must be delicate so as not to damage the protruding tips. The end result of such a solution is a complex and costly assembly process with small yield. In the disclosed embodiments, in contrast, the optical connector can be manufactured with fiber ends that are flush with the connector surface. This configuration protects the fiber ends from damage during the assembly process.

In some embodiments, for example when using a flexible PCB, the substrate is optically opaque. This feature eliminates cross-talk and other interference between transducers. PCB substrates also have lower cost relative to other types of substrate.

Several example configurations of optical interface modules and cable assemblies that use the disclosed techniques are described herein. In some embodiments, an optical connector using the disclosed techniques is produced by modifying a conventional Mechanical Transfer (MT) connector.

Optical Interface Module Description

FIG. 1 is a cross section of an optical interface module 20, in accordance with an embodiment of the present invention. Module 20 is used for terminating an bundle 28 of optical fibers 32, by connecting the fibers to respective optical transducers, such as Vertical-Cavity Surface-Emitting Lasers (VCSELs) 48 or Photo-Detectors (PDs) 50. A module of this sort can be used, for example, at the end of an optical cable assembly that connects to communication equipment.

A portion of module 20, which performs conversion between optical and electrical signals, is shown in the enlarged excerpt at the top-right of the figure. In this embodiment, an array of optical transducers is mounted on a substrate, in the present example a flexible Printed Circuit Board (PCB) 34. A micro-lens assembly 36 is coupled to the opposite side of the flexible PCB, in order to collimate (or focus) the light and couple it into and/or out of the ends of fibers 32. The optical elements of module 20 are physically aligned against one another using passive alignment guide pins 40 that fit into respective guide holes 44.

Flexible PCB 34 extends to the right-hand-side of module 20 in FIG. 1, and is connected to a rigid PCB 35 that connects to a Quad Small Form-factor Pluggable QSFP connector (not shown in the figure).

Figure 2:
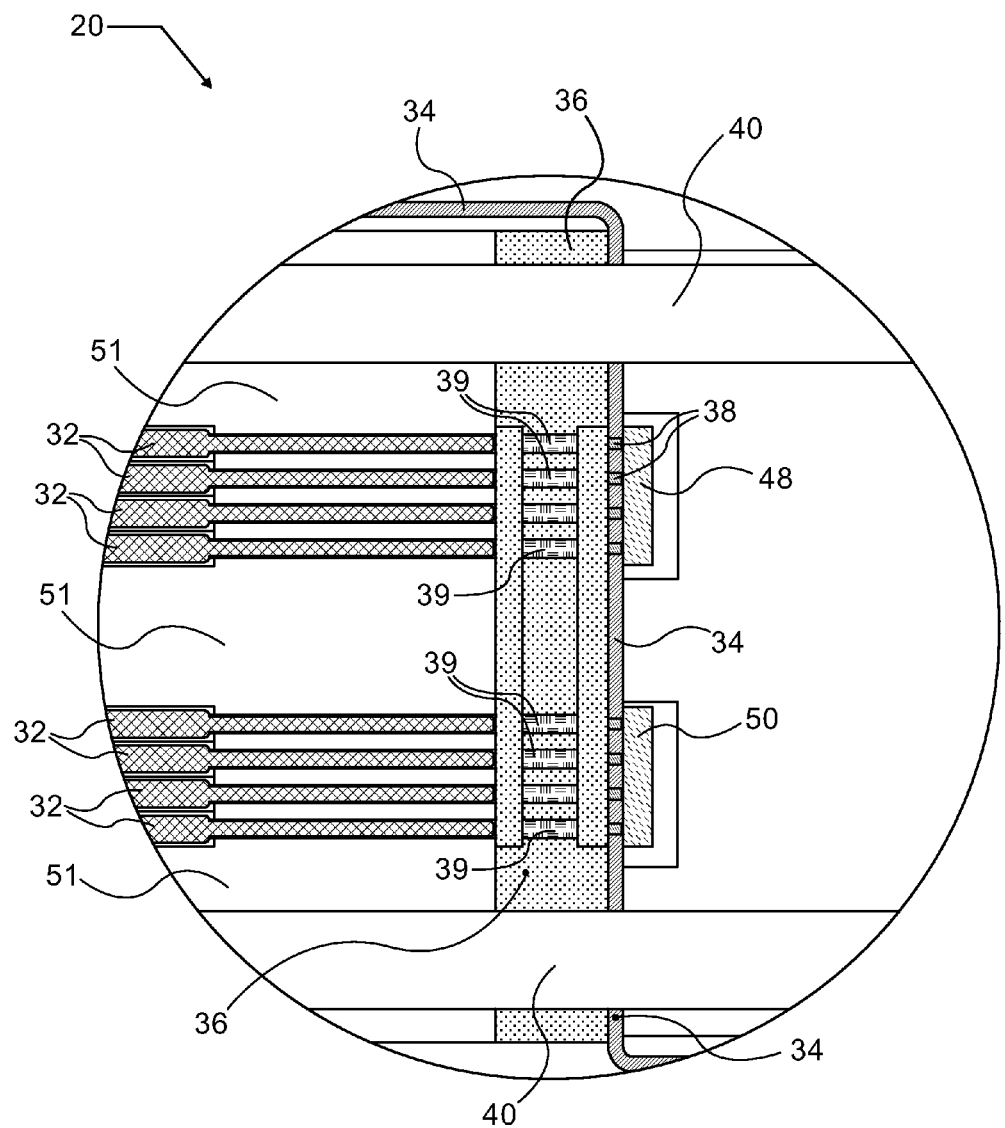
FIG. 2 is a cross section showing part of an optical interface module, in accordance with an embodiment of the present invention.

FIG. 2 is a cross section showing part of optical interface module 20, in accordance with an embodiment of the present invention. In the present example, the optical interface module comprises an array of four VCSELs 48 and an array of four PDs 50, each interfacing with a group of four fibers 32.

As can be seen in the figure, VCSELs 48 and PDs 50 are mounted on PCB 34. In this embodiment, VCSELs 48 comprise bottom-emitting VCSELs, and PDs 50 comprise bottom-detecting PDs, which point toward the surface of PCB 34. The array of VCSELs and the array of PDs are connected to PCB 34 using flip-chip mounting. Flip-chip is preferable over other interconnection technologies such as wire-bonding, because it causes little distortion to the electrical signals. In a typical implementation, the interface module is used for high-speed optical communication, e.g., a 25 Gbps link, in which case high signal integrity is essential.

On reception, an optical signal exits the end of a fiber 32, collimated by a respective micro-lens 39, then passes through a respective opening 38 in PCB 34, and is detected by a PD 50. The PD converts the optical signal into a respective electrical signal. On transmission, an electrical signal is provided to a VCSEL 48. The VCSEL converts the electrical signal into a respective optical signal, and emits the optical signal through the respective opening 38 in PCB 34. The optical signal is then collimated by the respective micro-lens 39 of assembly 36, and provided as input to the respective optical fiber 32.

Micro-lenses 39 help to collimate the light that travels between the ends of fibers 32 and the respective VCSELs or PDs. As can be seen in FIG. 2, the fiber ends are separated from the VCSELs and PDs by the thickness of PCB 34 (i.e., by the lengths of openings 38). In an example embodiment, PCB 34 has a thickness of 100 μm, although any other suitable thickness can be used. The light traveling through openings 38 will typically diverge, and micro-lenses 39 help to compensate for this divergence and collimate the light.

The use of micro-lenses 39 simplifies and reduces the cost of the assembly process of module 20. In the present example, the ends of fibers 32 are fixed in a connector block 51. When using micro-lenses 39, the ends of fibers 32 can be flush with the edge of connector block 51. This configuration protects the fiber ends from damage during production and assembly. Without the micro-lenses, the fiber ends would have to protrude beyond the edge of block 51 and extend through openings 38. This sort of solution is fragile, problematic and therefore costly.

Thus, the optical properties of micro-lenses 39 (e.g., focal length, working distance, spot size) are typically designed depending on the layout and mechanical tolerances of the module elements (e.g., depending on the length of openings 38, i.e., the thickness of PCB 34).

PCB 34 typically comprises circuit traces for carrying electrical signals between the optical transducers (e.g., VCSELS and/or PDs) and other electronic components (not shown). The other components may be mounted on PCB 34 or elsewhere. Such components may comprise, for example, drivers that drive the VCSELS with electrical signals to be converted to optical signals, Trans-Impedance Amplifiers (TIAs) that amplify the electrical signals produced by the PDs in response to received optical signals, control circuitry, or any other suitable components.

The use of PCB 34 in the configuration of FIGS. 1 and 2 enables very short electrical paths between the transducers and the additional components (e.g., from the drivers to the VCSELS and from the PDs to the TIAs). In one example embodiment, these electrical paths have a length on the order of 0.7 mm, which enables high signal integrity even for high-speed 25 Gbps electrical signals.

The configuration of module 20 shown in FIGS. 1 and 2 is an example configuration, which is chosen purely for the sake of clarity. In alternative embodiments, any other suitable optical module configuration can be used.

For example, module 20 may comprise any suitable number of optical transducers of any suitable type, which may be arranged mechanically in any other suitable arrangement. Micro-lens array 36 may be fabricated from any suitable material, such as glass or plastic.

Alternatively to PCB 34, the substrate on which the optical transducers are mounted may comprise any other suitable material and shape. In some embodiments, the substrate material is optically opaque, such that optical signals passing through openings 39 will not interfere with one another.

Example Lens Attachment Solutions

Module 20 of FIG. 1 may be assembled using various assembly processes. In some embodiments, module 20 comprises a cascade of three building blocks:

A Mechanical transfer (MT) connector, which terminates fibers 32 and ends with a flush surface comprising the fiber ends. This building block may comprise a conventional off-the-shelf MT connector.

Lens assembly 36.

A mechanical structure comprising PCB 34, the optical transducers and the additional components, including the QSFP connector.

Figure 3:
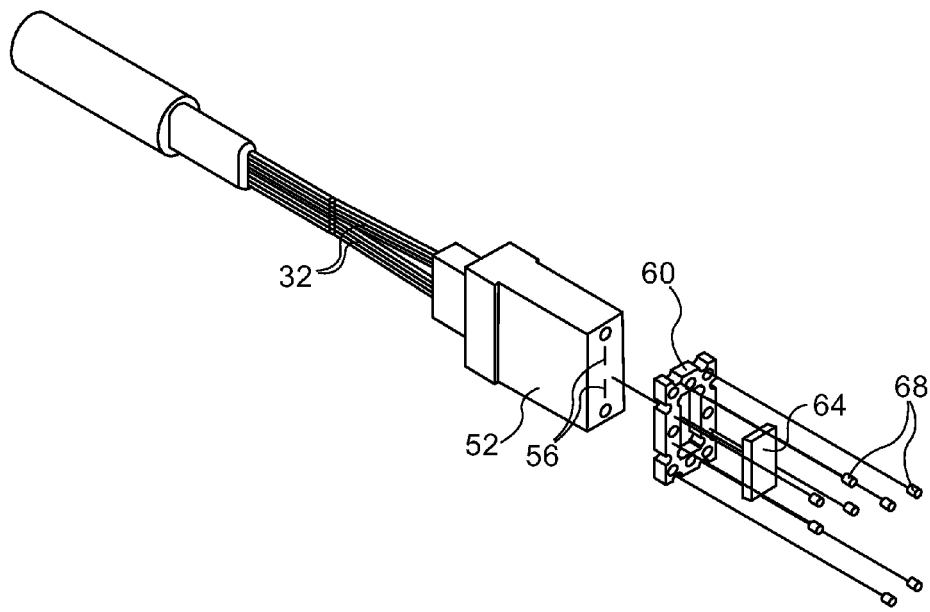
FIGS. 3 and 4 are exploded three-dimensional views of optical interface modules, in accordance with embodiments of the present invention.

FIG. 3 is an exploded three-dimensional view of an optical interface module, in accordance with an embodiment of the present invention. In this embodiment, the module is built using a standard MT connector 52 that terminates fibers 32. Ends 56 of fibers 32 are shown flush with the edge surface of the MT connector. A plastic fitting 60 holds a glass lens assembly 64 comprising eight glass micro-lenses. Fitting 60 is glued to connector 52 using multiple glue spots 68.

Figure 4:
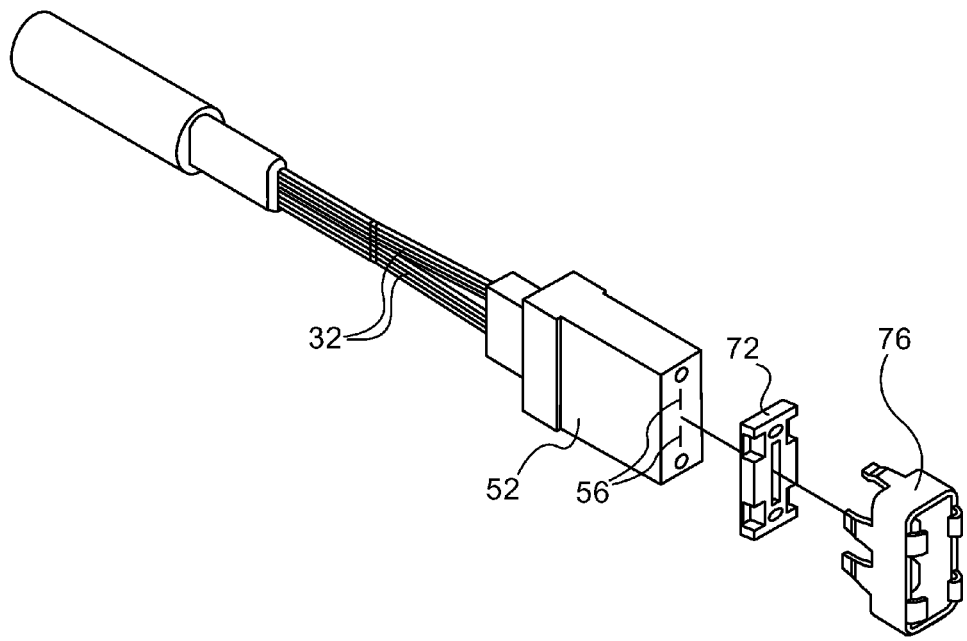

FIG. 4 is an exploded three-dimensional view of an optical interface module, in accordance with an alternative embodiment of the present invention. In this embodiment, too, the module is built using MT connector 52. In the present example, however, a lens assembly 72 is attached to connector 52 using a metallic spring fitting 76.

In the examples of FIGS. 3 and 4 the lens assembly is attached to the optical connector, and the combined element is then fitted to the mechanical structure using the guide pins. This assembly process, however, is shown purely by way of example. In alternative embodiments, the lens assembly may be first attached to the mechanical structure (e.g., to PCB 34), using gluing or otherwise. The resulting structure is then attached to the optical connector.

In alternative embodiments, the methods and systems described herein can also be used in other applications, such as in MT-to-MT connections, in which micro-lenses can be used to overcome dust contamination.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. Apparatus, comprising:
an optically opaque substrate, which comprises first and second opposite surfaces and has one or more openings traversing through the substrate between the first and second surfaces;
one or more optical transducers, which are attached to the first surface of the substrate so as to emit or detect light via the respective openings;
one or more lenses, comprised in a lens assembly, which lenses are positioned against the respective openings on the second surface of the substrate, and which are configured to couple the light between the optical transducers and respective optical fibers terminated by a connector; and
a spring fitting formed of a frame which encompasses the lens assembly and a plurality of elastic members that grasp the connector that terminates the optical fibers.

2. The apparatus according to claim 1, wherein the substrate comprises a Printed Circuit Board (PCB), and wherein the optical transducers are attached using flip-chip mounting to pads on the first surface of the PCB.

3. The apparatus according to claim 2, wherein the PCB comprises electrical traces for connecting the optical transducers via the pads to one or more electronic components.

4. The apparatus according to claim 1, and comprising a connector block, which is configured to hold ends of the optical fibers against the respective lenses, such that the ends of the optical fibers are flush with an edge of the connector block.

5. The apparatus according to claim 1, wherein the lenses are configured to compensate for a divergence of the light traversing the openings between the optical transducers on the first surface and the lenses on the second surface of the substrate.

6. The apparatus according to claim 1, wherein an optical characteristic of the lenses is defined depending on a thickness of the substrate.

7. The apparatus according to claim 1, wherein the lens assembly is glued to the connector that terminates the optical fibers.

8. A method, comprising:
providing an optically opaque substrate, which comprises first and second opposite surfaces and has one or more openings traversing through the substrate between the first and second surfaces;
attaching one or more optical transducers to the first surface of the substrate so as to emit or detect light via the respective openings; and
positioning one or more lenses, included in a lens assembly, against the respective openings on the second surface of the substrate, so as to couple the light between the optical transducers and respective optical fibers; and
attaching the lens assembly to a connector that terminates the optical fibers, using a spring fitting formed of a frame and a plurality of elastic members, by encompassing the lens assembly by the frame and moving the elastic members to grasp the connector.

9. The method according to claim 8, wherein the substrate comprises a Printed Circuit Board (PCB), and wherein attaching the optical transducers comprising mounting the optical transducers using flip-chip mounting to pads on the first surface of the PCB.

10. The method according to claim 8, wherein the PCB comprises electrical traces for connecting the optical transducers via the pads to one or more electronic components.

11. The method according to claim 8, and comprising holding ends of the optical fibers against the respective lenses using a connector block, such that the ends of the optical fibers are flush with an edge of the connector block.

12. The method according to claim 8, comprising gluing the lens assembly to the connector that terminates the optical fibers.

13. A cable assembly, comprising:
one or more optical fibers, terminated by a connector;
an optical interface module, which terminates the optical fibers and comprises:
an optically opaque substrate, which comprises first and second opposite surfaces and has one or more openings traversing through the substrate between the first and second surfaces;
one or more optical transducers, which are attached to the first surface of the substrate so as to emit or detect light via the respective openings; and
one or more lenses, comprised in a lens assembly, which lenses are positioned against the respective openings on the second surface of the substrate, and which are configured to couple the light between the optical transducers and the respective optical fibers; and
a spring fitting formed of a frame which encompasses the lens assembly and a plurality of elastic members that grasp the connector that terminates the optical fibers, so as to attach the lens assembly to the connector.

14. The method according to claim 8, wherein attaching the lens assembly to the connector is performed before positioning the one or more lenses, included in the lens assembly, against the respective openings on the second surface of the substrate.

* * * * *